United States Patent

(12) United States Patent
Lu et al.

(10) Patent No.: US 7,153,749 B1
(45) Date of Patent: Dec. 26, 2006

(54) METHOD OF TUNING THRESHOLD VOLTAGES OF INTERDIFFUSIBLE STRUCTURES

(75) Inventors: Ryan P. Lu, Carlsbad, CA (US); Ayax D. Ramirez, Chula Vista, CA (US); Bruce W. Offord, San Diego, CA (US); Stephen D. Russell, San Diego, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 11/070,634

(22) Filed: Mar. 2, 2005

(51) Int. Cl.
*H01L 21/336* (2006.01)
*H01L 21/00* (2006.01)

(52) U.S. Cl. .................................. 438/308; 438/795

(58) Field of Classification Search ................ 438/308
See application file for complete search history.

(56) References Cited

U.S. PATENT DOCUMENTS

| | | | |
|---|---|---|---|
| 6,156,654 A * | 12/2000 | Ho et al. | 438/683 |
| 6,984,551 B1 * | 1/2006 | Yamazaki et al. | 438/164 |
| 2002/0106858 A1 * | 8/2002 | Zheng et al. | 438/258 |
| 2005/0145893 A1 * | 7/2005 | Doczy et al. | 257/288 |

* cited by examiner

*Primary Examiner*—Lex H. Malsawma
(74) *Attorney, Agent, or Firm*—Allan Y. Lee; Michael A. Kagan; Peter A. Lipovsky

(57) ABSTRACT

A method of tuning threshold voltages of interdiffusible structures. The method includes a step of situating a interdiffusible structure in a path of a laser and a step of illuminating the interdiffusible structure with laser energy until a desired threshold voltage is obtained.

18 Claims, 6 Drawing Sheets

METHOD OF TUNING THRESHOLD VOLTAGES OF INTERDIFFUSIBLE STRUCTURES

BACKGROUND

The patent application is generally in the field of methods of microfabrication and nanofabrication.

Typical fabrication methods of modifying threshold voltages of solid-state devices require global processes such as varying metals, oxide thicknesses and doping, which greatly increases process complexity.

A need exists for methods of modifying threshold voltages of solid-state devices allowing local processes.

DETAILED DESCRIPTION

Described herein is Method of Tuning Threshold Voltages of Interdiffusible Structures.

Definitions

The following definitions and acronyms are used herein:

Acronym(s):

IS—Interdiffusible Structure(s)

UV—Ultraviolet

IR—Infrared

Definition(s):

Interdiffusible Structure—a structure having at least one metal layer, wherein material from the at least one metal layer is capable of diffusing into an adjacent metal or semiconductor layer.

Multiple IS device—a device having at least two IS.

The method of tuning threshold voltages of interdiffusible structures (IS) uses a laser to locally modify threshold voltages of interdiffusible structures. The method includes a step of situating a IS in the path of a laser and a step of illuminating the IS with laser energy.

FIGS. 1A–1E are cross-sectional side views of some of the features of an exemplary device formed in accordance with one embodiment of a method of tuning threshold voltages of interdiffusible structures. These intermediate stages of fabrication show some of the features of a method of tuning threshold voltages of interdiffusible structures. The components of FIGS. 1A–1E are not drawn to scale. These fabrication stages are described in detail below in relation to flowchart 200 of FIG. 2A and flowchart 202 of FIG. 2B.

Figure 2A:
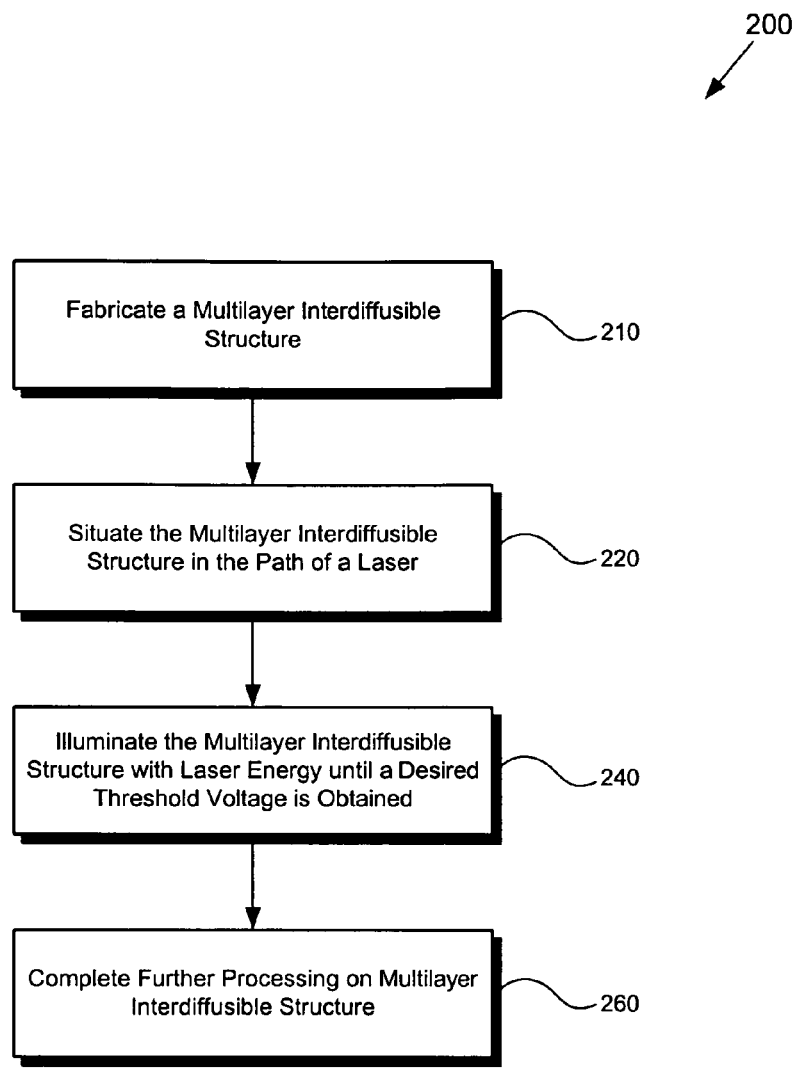
FIGS. 2A–2B are flowcharts of embodiments of a method of tuning threshold voltages of interdiffusible structures.
Figure 2B:
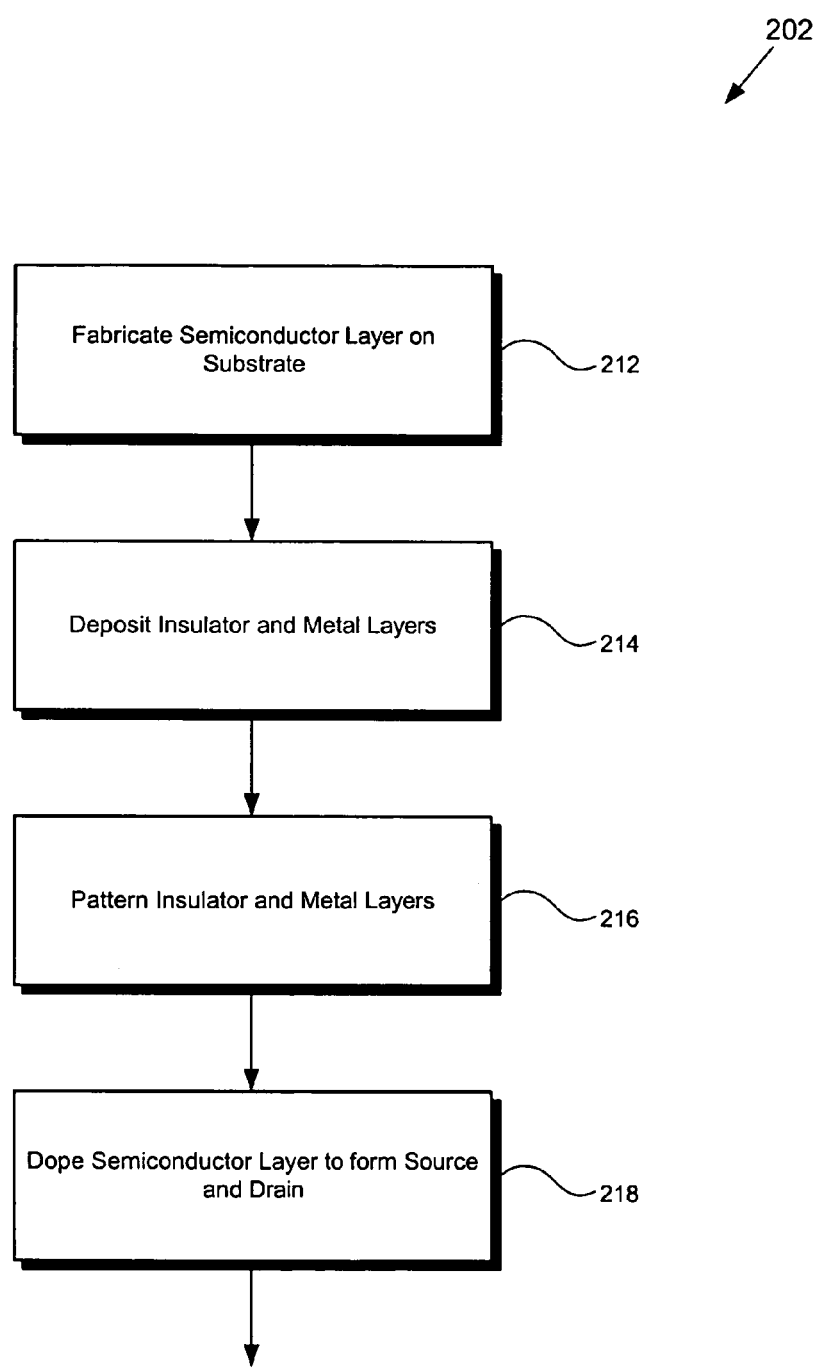

FIGS. 2A–2B are flowcharts of embodiments of a method of tuning threshold voltages of interdiffusible structures. Certain details and features have been left out of flowchart 200 of FIG. 2A and flowchart 202 of FIG. 2B that are apparent to a person of ordinary skill in the art. For example, a step may consist of one or more sub-steps or may involve specialized equipment or materials, as known in the art. While STEPS 210 through 260 shown in flowchart 200 are sufficient to describe one embodiment, other embodiments may utilize steps different from those shown in flowchart 200.

Figure 1A:
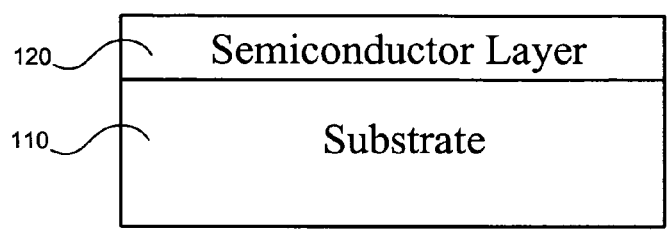
FIGS. 1A–E are cross-sectional side views of some of the features of an exemplary device formed in accordance with one embodiment of a method of tuning threshold voltages of interdiffusible structures.
Figure 1B:
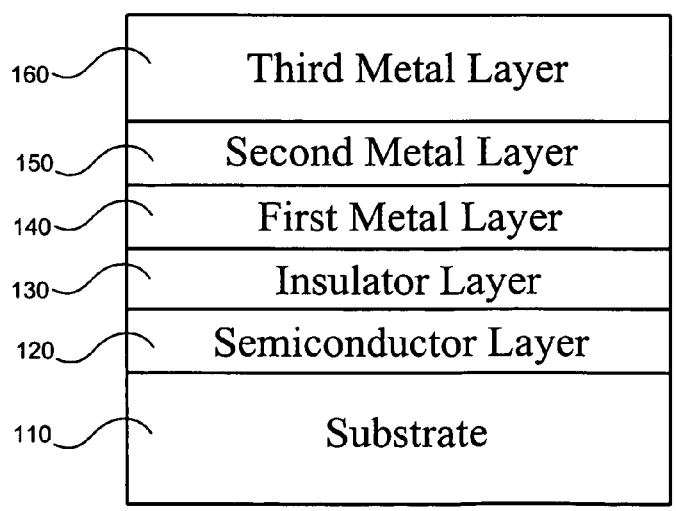
Figure 1C:
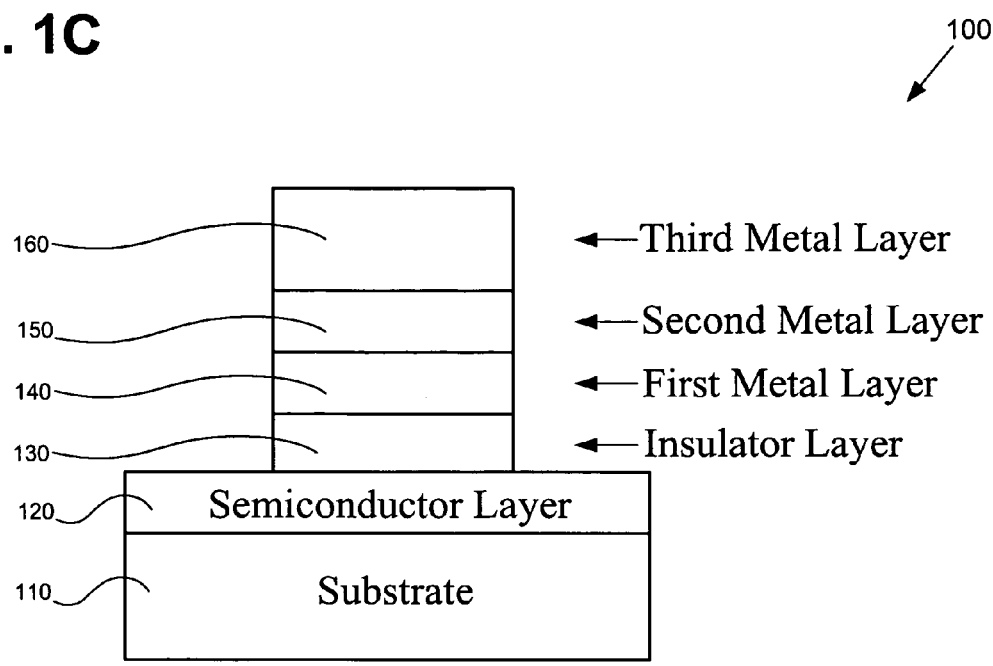
Figure 1D:
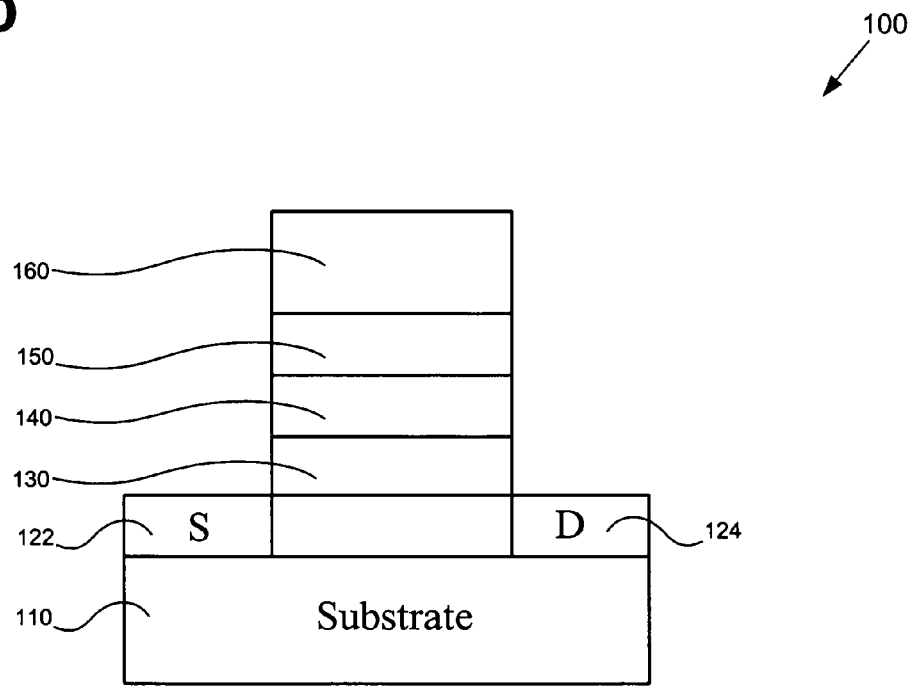

Referring to FIGS. 1D and 2A, at STEP 210 in flowchart 200, the method fabricates IS 100. IS 100 includes at least two adjacent metal layers, wherein material from one metal layer is capable of diffusing into another metal layer. As shown in FIG. 1D, IS 100 includes substrate 110, source 122, drain 124, insulator layer 130, first metal layer 140, second metal layer 150 and third metal layer 160. In one embodiment, material from second metal layer 150 is capable of diffusing into first metal layer 140. The composition of IS 100 is exemplary as the present method of tuning threshold voltages of IS can be used in conjunction with various IS such as, for example, MOSFET, MISFET, MESFET, semiconductor switches, diodes and LED.

In a MOSFET embodiment, IS 100 comprises the following: substrate 110 comprises an insulator such as oxide; source 122 and drain 124 comprise doped semiconductor material; insulator layer 130 comprises gate oxide; first metal layer 140 comprises a metal capable of receiving diffused material from second metal layer 150; second metal layer 150 comprises a metal capable of diffusing into first metal layer 140; third metal layer 160 comprises a metal. In an exemplary MOSFET embodiment, IS 100 comprises: substrate 110 comprising oxide, source 122 and drain 124 comprising doped silicon, insulator layer 130 comprising gate oxide, first metal layer 140 comprising titanium, second metal layer 150 comprising titanium nitride and third metal layer 160 comprising aluminum. In one embodiment, substrate 110 comprises oxide having a thickness of approximately 400 nm formed on a silicon layer; insulator layer 130 comprises gate oxide having a thickness of approximately 7 nm; first metal layer 140 comprises titanium having a thickness of approximately 10 nm; second metal layer 150 comprises titanium nitride having a thickness of approximately 50 nm; third metal layer 160 comprises aluminum having a thickness of approximately 200 nm. After STEP 210, the method proceeds to STEP 220.

Figure 1E:
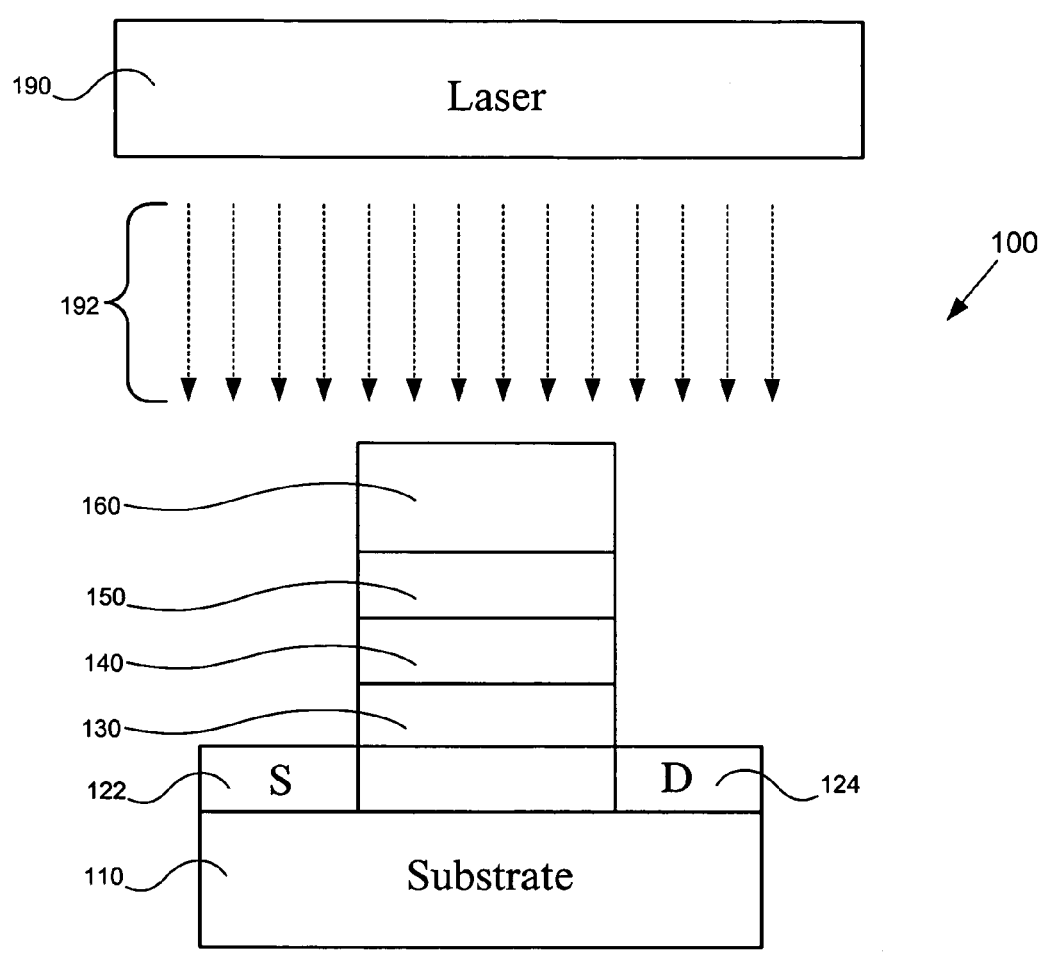

Referring to FIGS. 1E and 2A, at STEP 220 in flowchart 200, the method situates IS 100 in the path of laser 190. In one embodiment, the method situates IS 100 in the path of laser 190 using a moveable platen, which supports IS 100. In one embodiment, the method situates IS 100 in the path of laser 190 using a moveable laser. In one embodiment, the method situates IS 100 in the path of laser 190 using a redirected laser beam. After STEP 220, the method proceeds to STEP 240.

Referring to FIGS. 1E and 2A, at STEP 240 in flowchart 200, the method illuminates IS 100 with laser energy 192 (represented by arrows) until a desired threshold voltage is obtained. In an exemplary MOSFET embodiment, second metal layer 150 comprises titanium nitride having a work function of approximately 4.55 eV and first metal layer 140 comprises titanium having a work function of approximately 4.33 eV. In the exemplary MOSFET embodiment, the method illuminates IS 100 with laser energy 192, which results in the diffusion of nitrogen from titanium nitride (second metal layer 150) into titanium (first metal layer 140), which modifies the threshold voltage of IS 100. In one embodiment, the method at STEP 240 in flowchart 200 illuminates IS with laser energy 192 until a desired threshold voltage is obtained and to initiate thermal mixing and activation of channel dopants.

Laser 190 is capable of emitting laser energy 192 such as infrared (IR), visible and ultraviolet (UV) laser light. In one embodiment, laser 190 comprises a 308 nm XeCL excimer laser having a fluence of approximately 415 mJ/cm². In one embodiment, the method illuminates IS 100 with laser energy 192 using at least one laser pulse. In one embodiment, the method illuminates IS 100 with laser energy 192 using a series of laser pulses. In one embodiment, the method illuminates IS 100 with laser energy 192 using a series of laser pulses, wherein each laser pulse has a duration between approximately 10 ns and approximately 30 ns. In one embodiment, laser 190 comprises a continuous wave laser. In one embodiment, laser 190 comprises an incoherent non-monochromatic high intensity light source. Those skilled in the art shall recognize that desired threshold voltages can be obtained by varying laser energy power, pulse duration, number of pulses and related processing parameters without departing from the scope or spirit of the present method of tuning threshold voltages of interdiffusible structures. After STEP 240, the method proceeds to STEP 260 whereat the method completes further processing on IS structure such as annealing and packaging. The method terminates at STEP 260. Those skilled in the art shall recognize that the method of flowchart 200 can use interdiffusible structures having at least one metal layer, wherein material from the at least one metal layer is capable of diffusing into an adjacent semiconductor layer without departing from the scope or spirit of the present method of tuning threshold voltages of interdiffusible structures.

A multiple IS device embodiment of a method of tuning threshold voltages of interdiffusible structures is now described. A multiple IS device is a device having at least two IS such as, for example, a wafer having at least two MOSFETS including adjacent metal layers comprising titanium nitride and titanium. The exemplary method of tuning threshold voltages of interdiffusible structures comprises:

a) situating at least one IS of a multiple IS device in the path of a laser.

b) illuminating the at least one IS with laser energy until a desired threshold voltage is obtained.

c) repeating STEPS (a)–(b) for other IS of the multiple IS device until desired threshold voltages are obtained.

The multiple IS device embodiment allows localized tuning of threshold voltages for IS.

Referring to STEP 210 of flowchart 200 of FIG. 2A, an exemplary method of fabricating IS 100 is now described with reference to FIGS. 1A–1D and 2B. In the exemplary method of STEP 210, IS 100 comprises a metal-gate MOSFET device. Referring to FIGS. 1A and 2B, at STEP 212 of flowchart 202, the method fabricates semiconductor layer 120 on substrate 110. In one embodiment, the method fabricates semiconductor layer 120 on substrate 110 using SIMOX techniques. In one embodiment, semiconductor layer 120 comprises silicon. In one embodiment, substrate 110 comprises sapphire. In one embodiment, substrate 110 comprises oxide having a thickness of approximately 400 nm formed on a silicon layer. In one embodiment, substrate 110 comprises nitride. After STEP 212, the method proceeds to STEP 214.

Referring to FIGS. 1B and 2B, at STEP 214 of flowchart 202, the method deposits insulator and metal layers. In one embodiment, the method forms insulator layers and metal layers using oxidation and physical vapor deposition methods. In one embodiment, the method forms insulator layer 130 over semiconductor layer 120, first metal layer 140 over insulator layer 130, second metal layer 150 over first metal layer 140; and third metal layer 160 over second metal layer 150. In one embodiment, the method forms: insulator layer 130 comprising gate oxide having a thickness of approximately 7 nm, first metal layer 140 comprising titanium having a thickness of approximately 10 nm, second metal layer 150 comprising titanium nitride having a thickness of approximately 50 nm and third metal layer 160 comprising aluminum having a thickness of approximately 200 nm. After STEP 214, the method proceeds to STEP 216.

Referring to FIGS. 1C and 2B, at STEP 216 of flowchart 202, the method patterns insulator and metal layers. In one embodiment, the method patterns insulator layer 130, first metal layer 140, second metal layer 150 and third metal layer 160 to form a metal gate of a MOSFET device. After STEP 216, the method proceeds to STEP 218.

Referring to FIGS. 1D and 2B, at STEP 218 of flowchart 202, the method dopes semiconductor layer 120 to form source 122 and drain 124. In one embodiment, the method dopes semiconductor layer 120 to form source 122 and drain 124 using ion implantation. After STEP 218, the method proceeds to STEP 220 of flowchart 200 of FIG. 2A. After STEP 220, the method proceeds to STEPS 240 and 260 of flowchart 200 of FIG. 2A.

Figure 3:
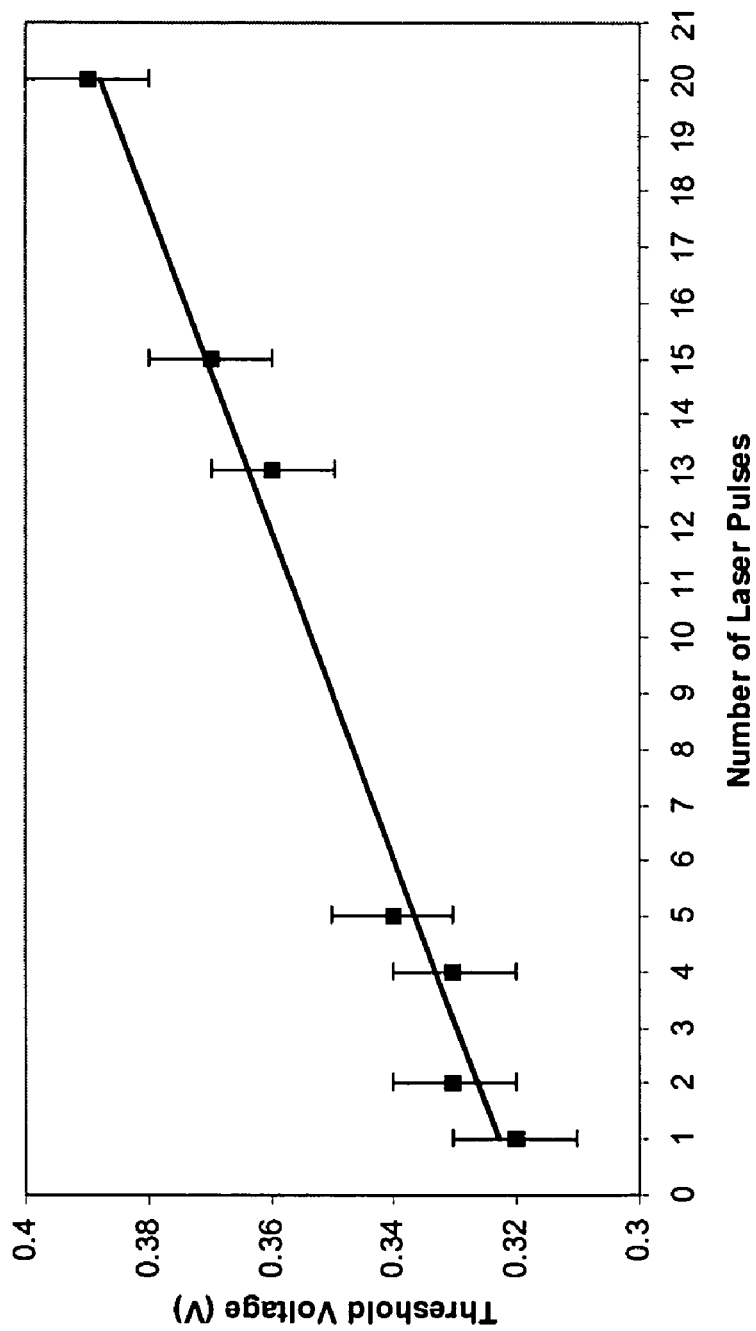
FIG. 3 is a graph representing exemplary results of a method of tuning threshold voltages of interdiffusible structures.

FIG. 3 is a graph representing exemplary results of a method of tuning threshold voltages of interdiffusible structures. The graph of FIG. 3 shows exemplary results for a IS MOSFET embodiment, where second metal layer 150 comprises titanium nitride having a work function of approximately 4.55 eV and first metal layer 140 comprises titanium having a work function of approximately 4.33 eV. In addition, the method illuminates the IS with laser energy using a series of UV laser pulses, wherein each laser pulse has a duration between approximately 10 ns and approximately 30 ns. As shown in FIG. 3, the threshold voltage increases depending on the number of laser pulses.

From the above description, it is manifest that various techniques can be used for implementing the concepts without departing from their scope. Moreover, a person of ordinary skill in the art would recognize that changes can be made in form and detail without departing from the spirit and the scope. The described embodiments are to be considered in all respects as illustrative and not restrictive. It should also be understood that the particular embodiments described herein are capable of many rearrangements, modifications, and substitutions without departing from the scope and spirit.

We claim:

1. A method of tuning threshold voltages of interdiffusible structures, the method comprising the steps of:

a) situating a interdiffusible structure in a path of a laser, wherein an insulator layer is situated between said interdiffusible structure and a substrate;

b) illuminating said interdiffusible structure with laser energy to cause interdiffusion in said interdiffusible structure until a desired threshold voltage is obtained.

2. The method of claim 1, wherein said interdiffusible structure comprises at least one metal layer, wherein material from said at least one metal layer is capable of diffusing into an adjacent layer.

3. The method of claim 2, wherein said adjacent layer comprises a second metal layer.

4. The method of claim 2, wherein said adjacent layer comprises a semiconductor layer.

5. The method of claim 1, wherein said interdiffusible structure comprises at least two adjacent metal layers, wherein material from a second metal layer is capable of diffusing into a first metal layer.

6. The method of claim 5, wherein said second metal layer comprises titanium nitride and said first metal layer comprises titanium.

7. The method of claim 1, wherein said interdiffusible structure comprises a device selected from the group consisting of MOSFET, MISFET, MESFET, semiconductor switches, diodes and LED.

8. The method of claim 1, wherein said situating STEP (a) comprises situating said interdiffusible structure in said path of said laser using a moveable platen, which supports said interdiffusible structure.

9. The method of claim 1, wherein said situating STEP (a) comprises situating said interdiffusible structure in said path of said laser using a moveable laser.

10. The method of claim 1, wherein said situating STEP (a) comprises situating said interdiffusible structure in said path of said laser using a redirected laser beam.

11. The method of claim 1, wherein said illuminating STEP (b) comprises illuminating said interdiffusible structure with laser energy using at least one laser pulse.

12. The method of claim 1, wherein said illuminating STEP (b) comprises illuminating said interdiffusible structure with laser energy using a series of laser pulses.

13. The method of claim 1, wherein said illuminating STEP (b) comprises illuminating said interdiffusible structure with laser energy using laser pulses having a duration between approximately 10 ns and approximately 30 ns.

14. The method of claim 1, wherein the method further comprises a STEP of fabricating said interdiffusible structure performed prior to said situating STEP (a).

15. The method of claim 14, wherein said fabricating STEP comprises the following sub-steps:
   i) fabricating a semiconductor layer on a substrate;
   ii) depositing at least two metal layers, wherein at least one metal layer of said at least two metal layers comprises an interdiffusible material;
   iii) patterning said at least two metal layers.

16. The method of claim 14, wherein said fabricating STEP comprises the following sub-steps:
   i) fabricating a semiconductor layer on a substrate;
   ii) forming at least one insulator layer and at least two metal layers, wherein at least one metal layer of said at least two metal layers comprises an interdiffusible material;
   iii) patterning said at least one insulator layer and said at least two metal layers.

17. The method of claim 14, wherein said fabricating STEP comprises the following sub-steps:
   i) fabricating a semiconductor layer on a substrate;
   ii) forming at least one insulator layer and at least two metal layers, wherein at least one metal layer of said at least two metal layers comprises an interdiffusible material;
   iii) patterning said at least one insulator layer and said at least two metal layers;
   iv) doping said semiconductor layer to form a source and a drain.

18. A method of tuning threshold voltages of interdiffusible structures, the method comprising the steps of:
   a) situating a interdiffusible structure of a multiple IS device in a path of a laser, wherein an insulator layer is situated between said interdiffusible structure and a substrate;
   b) illuminating said interdiffusible structure with laser energy to cause interdiffusion in said interdiffusible structure until a desired threshold voltage is obtained;
   c) repeating steps (a) and (b) for other interdiffusible structures of said multiple IS device until desired threshold voltages are obtained.

\* \* \* \* \*